(12) United States Patent
Denais

(10) Patent No.: US 7,966,144 B2
(45) Date of Patent: Jun. 21, 2011

(54) CLOCK CIRCUITS AND COUNTING VALUES IN INTEGRATED CIRCUITS

(75) Inventor: Mickael Denais, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 12/702,075

(22) Filed: Feb. 8, 2010

(65) Prior Publication Data

US 2010/0204944 A1 Aug. 12, 2010

Related U.S. Application Data

(63) Continuation of application No. 11/796,150, filed on Apr. 26, 2007, now Pat. No. 7,660,691.

(30) Foreign Application Priority Data

Apr. 27, 2006 (FR) ...................... 06 03807

(51) Int. Cl.
*G06F 19/00* (2006.01)
*G01R 31/00* (2006.01)

(52) U.S. Cl. ...................... 702/117; 702/176

(58) Field of Classification Search ............ 702/117, 702/176; 324/763, 765, 769; 438/10; 365/119
See application file for complete search history.

(56) References Cited

U.S. PATENT DOCUMENTS

| | | | |
|---|---|---|---|
| 5,600,578 | A | 2/1997 | Fang et al. |
| 7,009,905 | B2 | 3/2006 | Aipperspach et al. |
| 7,338,817 | B2 | 3/2008 | Liu et al. |
| 2003/0231028 | A1 | 12/2003 | Liu |
| 2004/0032244 | A1 | 2/2004 | Palm et al. |
| 2006/0049886 | A1 * | 3/2006 | Agostinelli et al. ......... 331/175 |

* cited by examiner

*Primary Examiner* — Bryan Bui

(57) ABSTRACT

A clock circuit for an integrated circuit having at least one MOS transistor. The clock circuit includes a first circuit for inducing a degradation of the transistor as a function of time and means for measuring a parameter of the transistor that reflects a lowering of the performance of the transistor resulting from the degradation. This also includes a method of generating a counting value of clock circuit by inducing continuous degradation of an MOS transistor. The method could include measuring a parameter of transistor, reflecting a lowering of performance of transistor resulting from said degradation. The method could also include measuring the temperature and calculating the counting value of the clock from the value of said parameter, from the measured temperature and from a law of variation of the parameter as a function of time and temperature.

19 Claims, 4 Drawing Sheets

CLOCK CIRCUITS AND COUNTING VALUES IN INTEGRATED CIRCUITS

This application is a continuation of prior U.S. patent application Ser. No. 11/796,150 filed on Apr. 26, 2007, now U.S. Pat. No. 7,660,691.

CROSS-REFERENCE TO RELATED APPLICATIONS

The present application is related to French Patent Application No. 06/03807, filed Apr. 27, 2006, entitled "CLOCK CIRCUIT FOR AN INTEGRATED CIRCUIT AND METHOD OF GENERATING A COUNTING VALUE OF SUCH A CLOCK CIRCUIT". French Patent Application No. 06/03807 is assigned to the assignee of the present application and is hereby incorporated by reference into the present disclosure as if fully set forth herein. The present application hereby claims priority under 35 U.S.C. §119(a) to French Patent Application No. 06/03807.

TECHNICAL FIELD

The present disclosure generally relates to integrated circuits and more particularly to the generation of an on-board clock for an integrated circuit.

BACKGROUND

Clock circuits for components such as, for example, integrated circuits are conventionally produced by mechanical or electrical counters. For example, clock circuits could use a quartz crystal because of its piezoelectric properties.

Conventional clock circuits, however, have a number of major drawbacks. For example, conventional clock circuits require a permanent source of power. If the power supply for the circuit is cut off, time can no longer be measured. The consumption of electrical power by such circuits is therefore relatively large. This problem becomes acute when a clock for smart cards has to be produced where consumption of electrical power is a constant concern.

Conventional clock circuits require a considerable footprint and thus could be detrimental in keeping an integrated circuit as compact as possible. Moreover, conventional clock circuits have a relatively complex structure and often times have a high manufacturing cost. Thus, conventional clock circuits cannot be used in integrated circuits where cost may be a factor.

Integrated circuit manufacturers are thus forced to compromise between the space required for mounting conventional clock circuits, the production cost of such circuits and the consumption of electrical power, which must remain relatively low.

There is therefore a need for an improved clock circuit for use in integrated circuits.

SUMMARY

In some embodiments, the present disclosure provides a clock circuit for an integrated circuit having a relatively simple structure and small footprint. In addition, embodiments of the present disclosure consume relatively less electrical power than conventional clock circuits.

In one embodiment, the present disclosure provides a clock circuit for use in an integrated circuit. The clock circuit includes a transistor. The clock circuit also includes a first circuit to induce degradation of the transistor as a function of time. The degradation is at least partially irreversible. The clock circuit further includes a second circuit to measure a parameter of the transistor. The measured parameter is indicative of lower performance of the transistor resulting from the degradation.

In another embodiment, the present disclosure provides a method of generating a counting value of a clock for use in an integrated circuit. The method includes continuously degrading a transistor and measuring a parameter of the transistor. The measured parameter is indicative of lower performance of the transistor resulting from the degradation. The degradation is at least partially irreversible. The method also includes measuring a temperature in the clock. The method further includes calculating a counting value of the clock from the value of the parameter, from the measured temperature and from a law of variation of the parameter as a function of time and temperature.

In still another embodiment, the present disclosure provides a clock circuit for use in an integrated circuit. The clock circuit includes an MOS transistor and a first circuit to induce degradation of the MOS transistor as a function of time. The degradation is at least partially irreversible. The first circuit also measures a parameter of the MOS transistor. The measured parameter is indicative of lower performance of the MOS transistor resulting from the degradation. The clock circuit also includes a temperature measurement stage to measure the temperature in the clock circuit. The clock circuit further includes a memory to store a law of variation of the measured parameter as a function of temperature and time. The clock circuit still further includes a calculating circuit to calculate an elapsed time between an initial state and a final state, using the value of the measured parameter, from a value of the measured parameter in the initial state and from the law of variation of the measured parameter.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
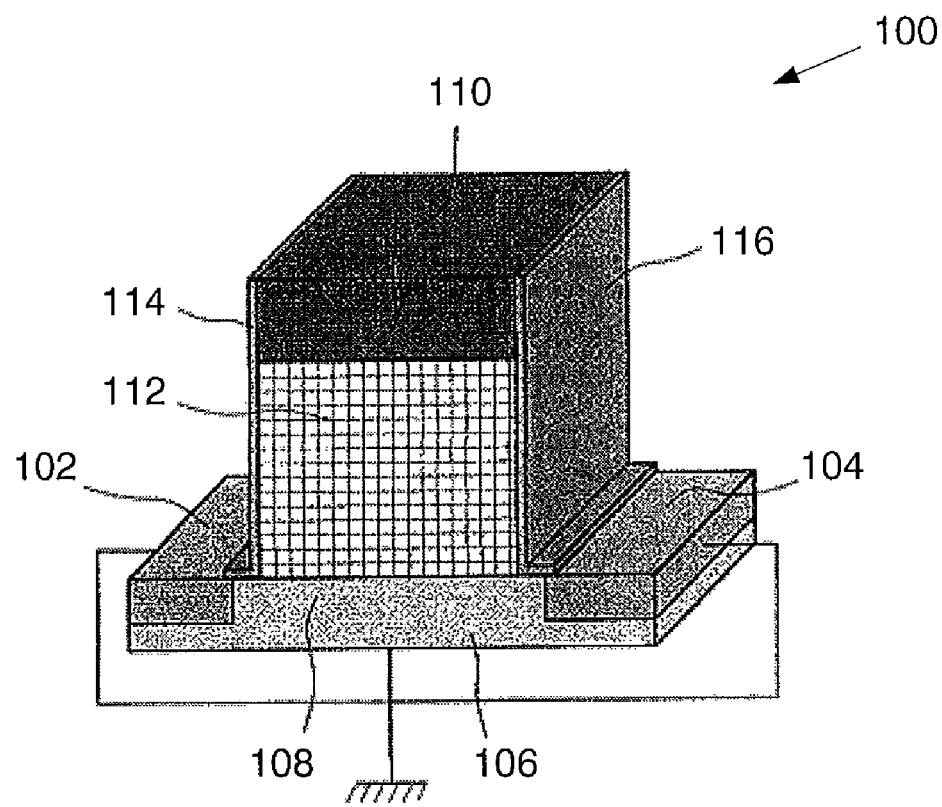
FIG. 1 is a somewhat simplified schematic view of an MOS transistor used for producing a clock circuit according to one embodiment of the present disclosure.

FIG. 1 shows the general structure of a transistor 100 forming part of a clock circuit according to one embodiment of the present disclosure. The embodiment of transistor 100 shown in FIG. 1 is for illustration purposes only. Other embodiments of transistor 100 may be used without departing from the scope of this disclosure. For example, transistor 100 may be any suitable transistor such as, for example, a pMOS or nMOS MOS transistor.

In one embodiment, the clock circuit of the present disclosure is based on constant degradation of transistor 100 over the course of time and on the measurement of a variation of an operating parameter of transistor 100 resulting from this degradation.

As described later in detail herein, degradation of transistor 100 may be induced by various conditions. For example, the degradation may be induced by negative stress as shown in FIG. 1. Negative stress degradation may be generally denoted by the term NBTI (negative bias temperature instability). Degradation of transistor 100 may also be induced by positive stress or PBTI (positive bias temperature instability) stress. In addition, degradation of transistor 100 may also be induced by an HCI (hot carrier injection) degradation or by an "offset" degradation.

Likewise, transistor 100 used for producing the clock circuit may be a pMOS or nMOS transistor. In one embodiment, it may be advantageous to induce an NBTI degradation in a pMOS transistor where the degradation is relatively rapid and easy to implement. Furthermore, this type of degradation has the advantage of not consuming current.

Still referring to FIG. 1, transistor 100 includes a source region (S) 102 and a drain region (D) 104 which are formed in a single-crystal substrate (Sb) 106 so as to define between them a channel region (C) 108. In one embodiment, single-crystal substrate (Sb) 106 is a bulk single-crystal silicon substrate. Furthermore, transistor 100 includes a gate region (G) 110 formed on top of channel region (C) 108, with the interposition of a gate oxide layer (Ox) 112. Spacer (E1) 114 and spacer (E2) 116 ensure lateral isolation of gate (G) 110.

According to one embodiment of the present disclosure, to induce a degradation of transistor 100 with a negative stress, as shown, a negative voltage is applied to gate (G) 110, while source (S) 102, drain (D) 104 and substrate (Sb) 106 are connected to ground.

Applying the negative voltage to gate region (G) 110 while the source (S) 102 and drain (D) 104 regions and the substrate (Sb) 106 are grounded induces a degradation in transistor 100. In particular, degradation occurs at the silicon/oxide interface between the substrate (S) 102 and the gate oxide layer (Ox) 112 and results in charge trapping. This phenomenon constantly increases while the stress is being maintained and is irreversible (at least in part). However, the degradation varies as a function of temperature as shown in FIG. 3.

Figure 3:
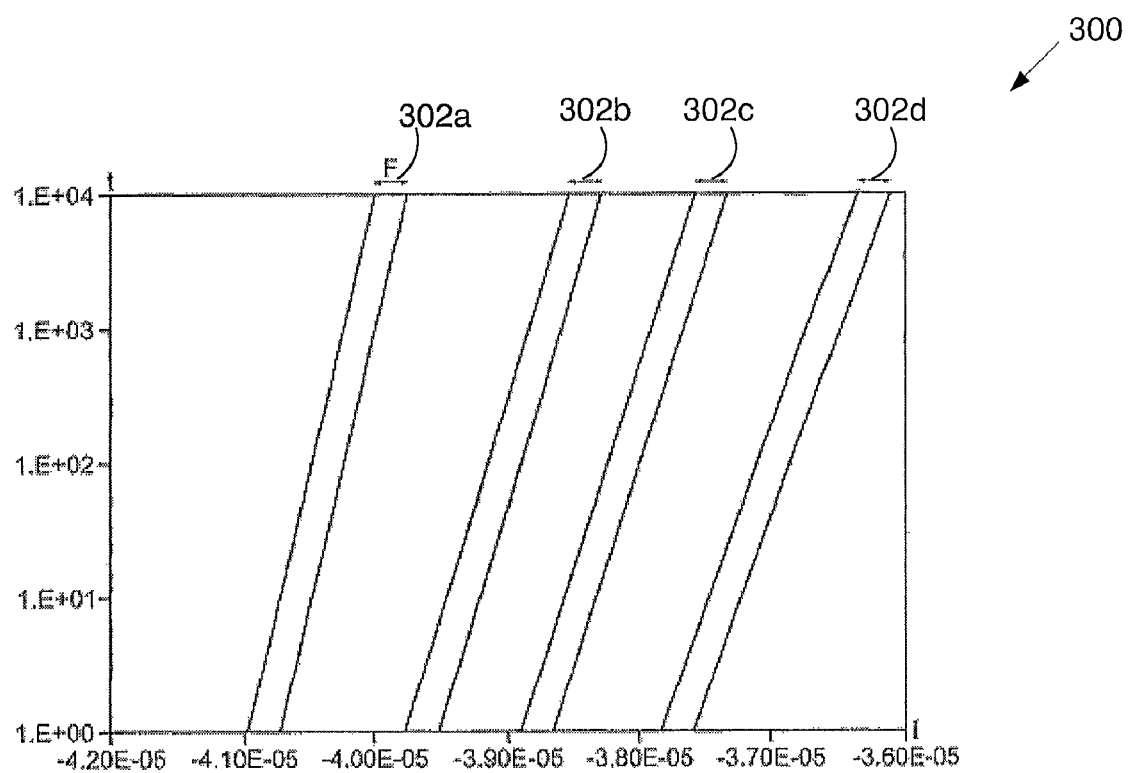
FIG. 3 illustrates varying drain current as a function of time for various temperatures according to one embodiment of the present disclosure.

Thus, referring briefly to plot 300 in FIG. 3, which shows the variation of the drain current (I) as a function of the degradation time (t), for various temperature values, it may be seen that the drain current (I) drops linearly as the duration of the degradation increases. Consequently, it is possible to calculate a time (t) from an initial state, from which the degradation is applied or, in general, from a reference time, by determining the variation of the drain current (I). However, it should be noted that the calculation of an elapsed time can also be made from any other operating parameter of transistor 100.

In this regard, it should be noted that it is also possible, as a variant, instead of the drain current (I), to calculate an elapsed time from a measurement of the threshold voltage, from the determination of the transconductance of transistor 100, or else from the slope, below the threshold, of the saturated current ($I_{sat}$) or else the slope of the current below the threshold, ($I_{off}$). In one embodiment, however, it may advantageous to measure the drain current (I) as this only requires applying a voltage to drain (D) 104 in order to obtain a measurement of the current directly.

Figure 2:
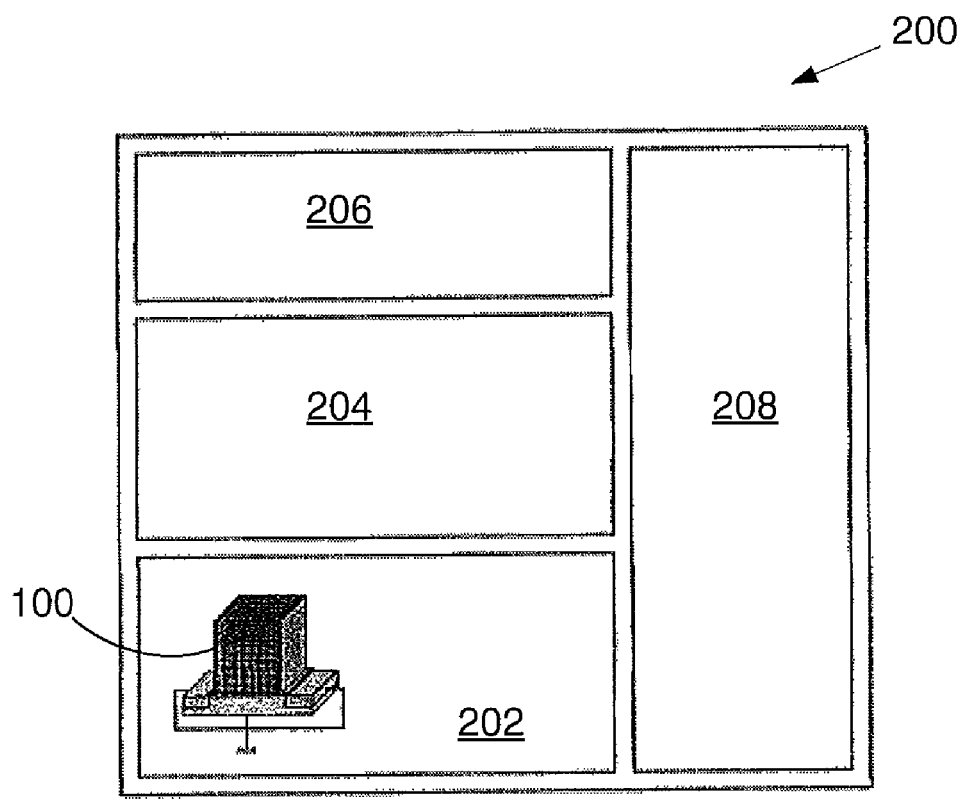
FIG. 2 is a somewhat simplified block diagram of a clock circuit according to one embodiment of the present disclosure.

An exemplary embodiment clock circuit 200 in accordance with the present disclosure is shown in FIG. 2. Clock circuit 200 includes an actual clock 202. Clock 202 is described in detail herein in conjunction with the description accompanying FIG. 4. Clock circuit 200 also includes a temperature measurement stage 204, a memory stage 206 and a central processing unit 208. Central processing unit 208 calculates the elapsed time from a measurement of an operating parameter of the transistor such as, for example, transistor 100, from an initial state, and from a model of the transistor 100.

Although the following descriptive assumes that the measured operating parameter consists of the drain current, other parameters may also be considered. As indicated above, the variation of the drain current as a function of time is dependent on temperature. Referring to plot 300 shown in FIG. 3, a temperature variation is reflected in a shift of the curve of variation of the drain current or, in general, of the parameter monitored, and in a change in the slope of this curve, which is capable of generating dispersion in the current values measured, as illustrated as arrows (F) 302a, 302b, 302c and 302d.

Thus, to determine the value of an elapsed time precisely, it is firstly necessary to measure the drain current and the temperature in an initial state so as to have information allowing the variation in the drain current to be determined. It is then necessary to calculate the elapsed time from the initial instant from the measured temperature, from the value of the drain current at a final instant and from the relationship between time, degradation and temperature modelled in the memory stage 206.

Figure 4:
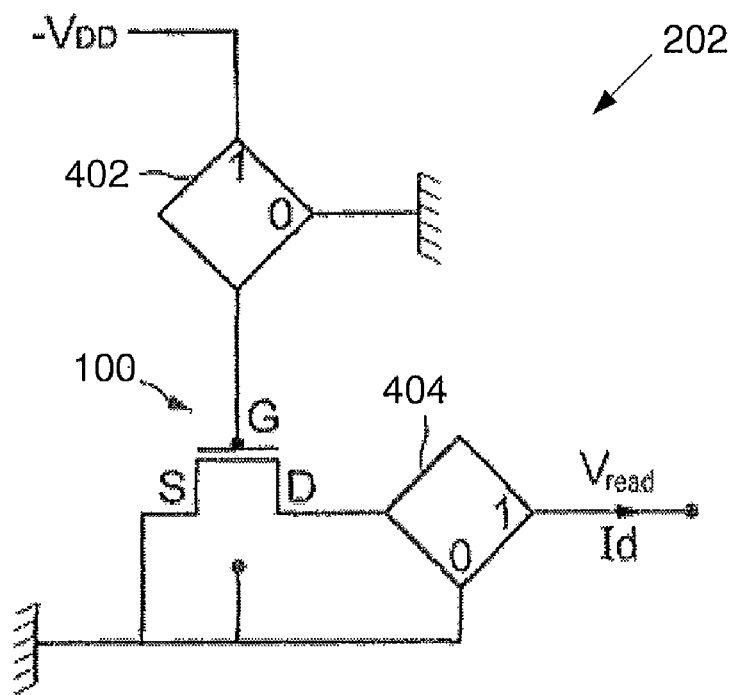
FIG. 4 is a somewhat simplified circuit diagram of the clock shown in FIG. 2.

FIG. 4 is a somewhat simplified circuit diagram of clock 202 shown in FIG. 2. Clock 202 includes transistor (T) such as, for example, transistor 100. The source (S) 102 and substrate (Sb) 106 of transistor 100 are connected to ground in order to apply an NBTI degradation (as one example). Clock 202 also includes a first switch 402, for selectively connecting the gate region (G) 110 either to a negative voltage $-V_{DD}$ during degradation or to a zero voltage. Clock 202 also includes a second switch 404 for connecting drain region (D) 104 either to ground, during degradation, or to a read voltage $V_{read}$, for example, of the order of 50 millivolts, when reading the current in drain (D) 104.

Thus, according to one embodiment of the present disclosure, in an initial state, the first switch 402 is controlled by processing unit 208, so as to connect the gate region (G) 110 to ground. The second switch 404 itself is controlled so as to apply the read voltage $V_{read}$ to the drain region (D) 104. Central processing unit 208 then acquires a measurement of the drain current ($I_d$) at the initial instant. This measurement is stored then in memory stage 206.

Central processing unit 208 also acquires a temperature value delivered by the corresponding measurement stage 204. Central processing unit 208 also controls the first and second switches 402 and 404 so as to apply the negative stress voltage $-V_{DD}$ to gate region (G) 110 and to connect drain region (D) 104 to ground, so as to induce an NBTI stress in transistor 100.

When desired to acquire the value of an elapsed time from the initial instant, it is then simply necessary to operate second switch 404 so as to apply the read voltage $V_{read}$ to drain region (D) 104 and thus acquire the value of the drain current. At the same time, it should be noted that it is possible to continue to apply the negative stress voltage $-V_{DD}$ to the gate region (G) 110 so as to maintain the degradation in such a way that the acquisition of the drain current has no influence on the degradation. From the read current and the model stored in memory in stage 206, central processing unit 208 directly acquires the value of the time elapsed from the initial instant.

It should be noted that in one embodiment, during the degradation, the stress applied to transistor 100 is a voltage stress and not a current stress. No current is therefore consumed. Furthermore, the degradation is irreversible (at least in part relating to the NBTI and completely irreversible in the HCI/off-state). Consequently, even if the voltage applied to the gate region (G) 110 is cut off, the degradation information remains preserved.

Finally, it should be noted that the present disclosure should not limited to the embodiment described. In the some of the embodiments described above, the temperature is measured by means of a specific temperature stage 204. The temperature may be obtained from a relationship between the drain current or threshold current and the temperature by means of the model stored in memory 206. It should be noted, however, that the temperature may also be determined while the stress is being applied to transistor 100, so as to take into account the variation in temperature. It is also possible to determine the temperature from the change in the operating parameter of the transistor 100 being monitored, from a determination of the slope of variation of this parameter, which also depends on the temperature.

Moreover, in some of the embodiments, the operating parameter of transistor 100 is measured only once. It is also possible, as a variant, to carry out successive measurements of the parameter. In addition, in some embodiments, the duration is determined from the value of the monitored parameter in the initial state, from the temperature, from the value of the monitored parameter in the final state and from a model linking the variation of the monitored parameter as a function of time and temperature, which is stored in memory in stage 206.

It is also possible, as a variant or complementarily, to calibrate transistor 100 at the start of degradation, by performing a measurement of the operating parameter of the transistor 100 for a few seconds so as to know the variation of this parameter as a function of time.

Finally, it should be noted that embodiments of the present disclosure may be suitable for down-counting durations of the order of 1 to 1000 seconds.

Accordingly, in one embodiment, the present disclosure provides a clock circuit 200 for an integrated circuit including at least one transistor 100. Clock circuit 200 could include a means for inducing a degradation of transistor 100 as a function of time and means for measuring a parameter of transistor 100 that reflects a lowering of the performance of transistor 100 resulting from said degradation. It is thus possible, by simple processing of the variation of the transistor parameter as a function of time due to the degradation of transistor 100, to measure a time starting from an initial state.

In one embodiment, NBTI type degradation is used on transistor 100. Thus, the degradation could be accomplished by applying a negative voltage to gate (G) 110 of transistor 100 to connect drain (D) 104 and the source (S) 102 of transistor 100 to ground. Thus, the stress applied to transistor 100 is a voltage stress and no current is consumed.

In one embodiment, it is also possible to use a degradation of the PBTI type by applying a positive voltage to gate (G) 110 of transistor 100 and for connecting drain (D) 104 and source (S) 102 of transistor 100 to ground. Although in this case a gate current could appear in the ultra-thin gate oxide transistor, the value of this current remains very low so that the consumption by the clock circuit remains negligible.

In one embodiment, it is also possible to use a degradation of the HCI type by applying a positive voltage to drain (D) 104 of transistor 100 and to gate (G) 110 of transistor 100. In this case, the current consumed by the clock circuit 200 may be slightly larger, but it does remain compatible with the requirements needed for integrating a clock on an integrated circuit.

In still other embodiments, it is also possible to use a degradation of the "off-state" type. In this case, the means for inducing the degradation by applying a positive voltage only to drain (D) 104 of transistor 100. The consumption by clock circuit 200, which is slightly greater than that with a stress of the NBTI or PBTI type, remains low in so far as the current consumed essentially corresponds only to a leakage current that appears between drain (D) 104 and substrate (S) 102 of transistor 100.

In one embodiment, clock circuit 200 include any suitable temperature measurement means, memory means in which a law of variation of the parameter as a function of temperature and time is stored, and calculating means for calculating an elapsed time between an initial state and a final state, from the value of the measured parameter, from a value of said parameter in the initial state and from the law of variation of the parameter. For example, the memory means include, stored in memory, a model of the or each MOS transistor 100.

According to yet another embodiment, clock circuit 200 may include means for calibrating the clock by successive measurements of said parameter at successive instants. For example, the measured parameter, reflecting the lowering of the performance of transistor 100 resulting from the degradation, is the drain current or the threshold voltage.

In one embodiment, the present disclosure provides a method of generating a counting value of clock circuit 200 by continuous degradation of an MOS transistor 100. The method could include measuring a parameter of transistor 100, reflecting a lowering of performance of transistor 100 resulting from said degradation. The method could also include measuring the temperature and calculating the counting value of the clock 202 from the value of said parameter, from the measured temperature and from a law of variation of the parameter as a function of time and temperature.

Within the context of the present disclosure, the term "integrated circuit" is understood to mean any type of electronic circuit or chip card that integrates several types of electronic components in a small volume which are, for example, mounted on the surface of a printed circuit.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. For use in an integrated circuit, a clock circuit comprising:
   a first circuit configured to induce degradation of a transistor in a manner permanently altering at least one parameter of the transistor;
   a second circuit configured to measure the at least one parameter of the transistor; and
   a central processing unit configured to determine an elapsed time based on a comparison of the measurement of the at least one parameter with a previous measurement of the at least one parameter.

2. The clock circuit of claim 1, wherein the first circuit comprises:
   the transistor coupled between a first switch and a second switch;
   the first switch configured to selectively connect the transistor to one of a negative voltage and a zero voltage; and
   the second switch configured to connect the transistor to one of a ground and a read voltage.

3. The clock circuit of claim 2, wherein the transistor comprises
   a single crystal substrate comprising a source region and a drain region, wherein the single crystal substrate further comprises a channel region disposed between the source and the drain;
   a gate region disposed over the channel region;
   a first and second spacer disposed adjacent to the gate region and configured to ensure lateral isolation of the gate region; and
   a gate oxide layer disposed between the gate region and the channel region, wherein the gate region is adapted to be coupled to a first circuit and wherein, in response to a signal received from the first circuit, a degradation is induced in the transistor, and wherein at least one measurable parameter of the transistor varies as a result of the degradation.

4. The clock circuit of claim 2, wherein the central processing unit is configured to control operation of the first switch and the second switch to determine an elapsed time based on the comparison of the measurement of the at least one parameter with the previous measurement of the at least one parameter.

5. The clock circuit of claim 2, wherein the central processing unit is configured to control operation of the first switch and the second switch to induce a negative bias temperature instability (NBTI) on the transistor.

6. The clock circuit of claim 1, wherein a voltage stress is applied to the transistor to induce the degradation of the transistor.

7. The clock circuit of claim 1, wherein the at least one parameter is one of: a change in a drain current and a change in a threshold voltage.

8. The clock circuit of claim 7, wherein the second circuit comprises a temperature measurement circuit configured to determine a change in temperature based on a model of a relationship between temperature and at least one of a drain current and a threshold voltage.

9. The clock circuit of claim 1, wherein at least a portion of the degradation of the transistor is irreversible.

10. The clock circuit of claim 1, wherein the second circuit is configured to calibrate the clock circuit by measuring the at least one parameter for a specified duration to determine a variation of the at least one parameter as a function of time.

11. The clock circuit of claim 1, wherein the second circuit is configured to calibrate the clock circuit by measuring the at least one parameter at successive instants in time to determine a variation of the at least one parameter as a function of time.

12. For use a clock circuit in an integrated circuit, a transistor comprising:
    a single crystal substrate comprising a source region and a drain region, wherein the single crystal substrate further comprises a channel region disposed between the source and the drain;
    a gate region disposed over the channel region;
    a first and second spacer disposed adjacent to the gate region and configured to ensure lateral isolation of the gate region; and
    a gate oxide layer disposed between the gate region and the channel region, wherein the gate region is adapted to be coupled to a first circuit and wherein, in response to a signal received from the first circuit, a degradation is induced in the transistor, and wherein at least one measurable parameter of the transistor varies as a result of the degradation.

13. The transistor of claim 12, wherein the transistor is an NMOS transistor.

14. The transistor of claim 12, wherein the transistor is a PMOS transistor.

15. The transistor of claim 12, wherein the degradation is induced by a negative bias temperature instability (NBTI) on the transistor.

16. The transistor of claim 12, wherein the degradation is induced by a positive bias temperature instability (PBTI) on the transistor.

17. The transistor of claim 12, wherein the degradation is induced by a hot carrier injection (HCI).

18. The transistor of claim 12, wherein the at least one parameter comprises a change in drain current.

19. The transistor of claim 12, wherein the at least one parameter comprises a change in a threshold voltage.

* * * * *